US009136195B2

(12) United States Patent
Golden et al.

(10) Patent No.: US 9,136,195 B2
(45) Date of Patent: Sep. 15, 2015

(54) OXYGEN BARRIER COMPOSITIONS AND RELATED METHODS

(75) Inventors: Josh H. Golden, Santa Cruz, CA (US); Matthew P. Galla, Los Altos, CA (US); Luis A. Navarro, San Carlos, CA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 899 days.

(21) Appl. No.: 12/460,338

(22) Filed: Jul. 17, 2009

(65) Prior Publication Data

US 2011/0011533 A1 Jan. 20, 2011

(51) Int. Cl.
| | |
|---|---|
| C08L 63/00 | (2006.01) |
| H01L 23/29 | (2006.01) |
| C08G 59/17 | (2006.01) |
| C08G 59/22 | (2006.01) |
| C08G 59/38 | (2006.01) |
| C09D 163/00 | (2006.01) |

(52) U.S. Cl.
CPC .......... *H01L 23/295* (2013.01); *C08G 59/1466* (2013.01); *C08G 59/226* (2013.01); *C08G 59/38* (2013.01); *C09D 163/00* (2013.01); *C08L 63/00* (2013.01); *H01L 2924/0002* (2013.01)

(58) Field of Classification Search
CPC ...................................................... C08L 63/00
USPC ....................................................... 525/524
See application file for complete search history.

(56) References Cited

U.S. PATENT DOCUMENTS

| | | | | | |
|---|---|---|---|---|---|
| 3,420,914 | A | * | 1/1969 | May ........................ | 525/303 |
| 3,637,618 | A | * | 1/1972 | May ........................ | 25/531 |
| 3,853,962 | A | * | 12/1974 | Gander ..................... | 560/221 |
| 4,315,237 | A | | 2/1982 | Middleman et al. | |
| 4,412,048 | A | | 10/1983 | Dixon et al. | |
| 4,636,431 | A | * | 1/1987 | DeBergalis ................ | 427/327 |
| 4,786,888 | A | | 11/1988 | Yoneda et al. | |
| 5,300,541 | A | | 4/1994 | Nugent et al. | |
| 5,351,026 | A | | 9/1994 | Kanbara et al. | |
| 5,573,819 | A | * | 11/1996 | Nugent et al. ............. | 428/34.8 |
| 5,840,825 | A | | 11/1998 | Carlblom et al. | |
| 5,959,846 | A | | 9/1999 | Noguchi et al. | |
| 6,023,403 | A | | 2/2000 | McGuire et al. | |
| 6,312,828 | B1 | * | 11/2001 | Akao ........................ | 428/516 |
| 6,555,187 | B1 | * | 4/2003 | Kitamura .................. | 428/1.53 |
| 7,371,459 | B2 | | 5/2008 | Galla | |
| 2002/0153325 | A1 | * | 10/2002 | Martin ...................... | 210/743 |
| 2005/0171229 | A1 | | 8/2005 | Mirone et al. | |
| 2006/0051588 | A1 | | 3/2006 | Galla | |
| 2006/0223937 | A1 | | 10/2006 | Herr et al. | |
| 2010/0120993 | A1 | * | 5/2010 | Chatterjee et al. .......... | 525/464 |
| 2010/0182121 | A1 | | 7/2010 | Li et al. | |
| 2011/0014415 | A1 | | 1/2011 | Navarro et al. | |
| 2011/0241818 | A1 | | 10/2011 | Sha et al. | |

FOREIGN PATENT DOCUMENTS

| | | |
|---|---|---|
| CA | 1127320 A1 | 7/1982 |
| CN | 1744792 A | 3/2006 |
| CN | 101221846 A | 7/2008 |
| CN | 101271751 A | 9/2008 |
| CN | 101312087 A | 11/2008 |
| CN | 101335125 A | 12/2008 |
| EP | 1350822 A1 | 10/2003 |
| EP | 1632960 A1 | 3/2006 |
| EP | 1992654 A1 | 11/2008 |
| GB | 2 038 549 A | 7/1980 |
| JP | 55-98801 A1 | 7/1980 |
| JP | 5-234706 A2 | 9/1993 |
| JP | 09-36282 A | 2/1997 |
| JP | 63-244702 A | 10/1998 |
| JP | 11-172076 A | 6/1999 |
| JP | 2001-040122 A | 2/2001 |
| JP | 2005-154386 A | 6/2005 |
| JP | 2006-121049 A3 | 5/2006 |
| JP | 3137920 U4 | 12/2007 |
| WO | WO-93/07068 A1 | 4/1993 |
| WO | WO-01/60701 A2 | 8/2001 |
| WO | WO-2006/107748 A1 | 10/2006 |
| WO | WO-2007/111606 A1 | 10/2007 |
| WO | WO-2007/114822 A1 | 10/2007 |

OTHER PUBLICATIONS

International Search Report for International Application No. PCT/US2010/002004, mailed Feb. 10, 2011.
International Search Report for International Application No. PCT/US2010/002005, mailed Nov. 29, 2010.
R. Bruce Prime, "An Introduction to Thermosets", www.primethermosets.com, (link: introtothermosets.pdf), pp. 1-8, printed Mar. 5, 2012.
"Basics of Barriers—1", MOCON 2007 Internet Seminar, Oct. 10, 2007.
"Dow Liquid Epoxy Resins", Dow Chemical brochure, pp. 1-44, Jan. 1999.
David Bednar, "New Halogen-Free Materials: Their Time Has Finally Arrived", circuitree.com, pp. 26-29, Sep. 2008.
David W. Brooks, "Barrier Materials and Technology", *PET Packaging Technology*, pp. 98-115, Mar. 21, 2002.
ERISYS™ GA-240 Tetraglycidyl meta-Xylenediamine Technical Bulletin, CVC Thermoset Specialties, Nov. 24, 2008.
ERISYS™ RDGE H Resorcinol Diglycidyl Ether Technical Bulletin, CVC Thermoset Specialties, Aug. 21, 2008.

(Continued)

*Primary Examiner* — Megan McCulley

(57) ABSTRACT

Oxygen barrier compositions for electrical devices and their related methods are provided. In certain embodiments, the oxygen barrier compositions comprise a meta-substituted aromatic resin and an additional aromatic epoxy resin. In some embodiments, the compositions have a chlorine content of less than approximately 1000 ppm. The compositions may have an oxygen permeability of less than approximately 0.4 cm$^3$·mm/m$^2$·atm·day at approximately 0% relative humidity and approximately 23° C. In certain embodiments, methods of curing the oxygen barrier compositions comprise partially curing the composition where, the partial cure is achieved through ultraviolet radiation or heat.

6 Claims, No Drawings

(56) References Cited

OTHER PUBLICATIONS

Kiichiro Seki, "Amine Epoxy Resin Curing Agent Offers Versatility", originally printed in Modern Paint and Coatings, pp. 36-40, Mar. 1995.

L.S. Penn & H. Wang, "Epoxy Resins", *Handbook of Composites*, S.T. Peters, ed., pp. 48-74, 1998.

M.H. Klopffer & B. Flaconneche, "Transport Properties of Gases in Polymers: Bibliographic Review", Oil & Gas Science and Technology, Rev. IFP, vol. 56, No. 3, pp. 223-244, 2001.

Morris Salame, "Structure/Property Relationships of High Barrier Polymers Reelvant to Food & Beverage Packaging", First International Conference on New Innovations in Packaging Technologies and Markets, pp. 233-259, Nov. 1983.

""NEOPOL" & "U-PiCA" Epoxyacrylate & Urethaneacrylate for UV Curing", Japan U-PiCA Company, Ltd. bulletin, Nov. 2008.

Osamu Hara, "Curing Agents for Epoxy Resin", ThreeBond Technical News, vol. 32, Dec. 20, 1990.

Raj B. Durairaj, "Resorcinol Additives for Packaging Extend Product Life for Food and Drink", Plastics Additives and Compounding, pp. 30-34, Oct. 1999.

TETRAD-X N,N,N',N'-tetraglycidyl-m-xylenediamine datasheet, Mitsubishi Gas Chemical Company, Inc., undated.

First Office Action from the State Intellectual Property Office of People's Republic of China for Chinese Application No. 201080031875.8, dated Jan. 29, 2013.

Third Office Action from the State Intellectual Property Office of People's Republic of China for Chinese Application No. 201080031875.8, dated Jul. 2, 2014.

\* cited by examiner

OXYGEN BARRIER COMPOSITIONS AND RELATED METHODS

TECHNICAL FIELD

The present disclosure relates to oxygen barrier compositions and their methods of cure. More particularly, the disclosure relates to oxygen barrier compositions for protection of electrical devices and their methods of cure.

BACKGROUND

Electrical properties of electrical devices may deteriorate over time without the protection of an oxygen or a moisture barrier sealant. In particular, a polymeric positive temperature coefficient (PPTC) device may consist of air sensitive and low resistivity nickel particles dispersed in a partially crystalline polymer matrix, and over time, ambient oxygen may permeate into amorphous regions of composite and oxidize the surface of the nickel particles. As a result, after a trip event or thermal cycling, the electrical pathway that is reestablished consists of surface oxidized nickel particles in contact with each other. The multitude of oxidized contact points results in an increase in electrical resistance. This increase results in devices that are "out of spec" and unacceptable for use. To prevent oxidation, electrical devices may be externally coated with a two-part epoxy-based oxygen barrier composition.

While the current two-part compositions may provide an effective oxygen and moisture barrier for certain applications such as protection of battery strap PPTC devices, they are somewhat limited in their scope of use and application. Some disadvantages of the two-part compositions include: a short pot life (i.e., working life), a substantial fraction of organic solvent (e.g., 20%), halogen contaminants, and a restriction of application to thin coatings on the outside of larger form factor PPTC devices. These coatings are also typically applied in a multi-step overcoating process. These solvent-borne formulations are also difficult to implement in underfill or gap fill type applications because of solvent trapping issues in the interstitial spaces of the laminate or other structures containing the active devices.

Therefore, there is a need for improved oxygen barrier compositions for electrical devices with improved pot life, low or no volatile organic compounds ("VOCs"), as well as reduced levels of halogen contaminants, such as chlorine and bromine. There is also a need to prevent oxidation of smaller form factor PPTC devices, such as surface mount devices (SMDs), which are more susceptible to nickel filler oxidation because they have a greater surface area to volume ratio, and are difficult to coat using standard methods. Finally, there is also a need for control over the degree of cure of the resin system during various stages of the device manufacture process, especially in terms of SMD PPTC device manufacture.

BRIEF SUMMARY

Embodiments of the present invention generally provide oxygen barrier compositions and methods of curing the compositions.

In one embodiment, the oxygen barrier composition comprises a meta-substituted aromatic resin and an additional aromatic epoxy resin. In some embodiments, the meta-substituted aromatic resin is selected from the group consisting of: meta-substituted resorcinol epoxy resins, meta-substituted acrylic resorcinol resins, meta-substituted methacrylic-resorcinol resins, meta-substituted tetraglycidyl xylenediamine resins, resorcinol, and combinations thereof. In some embodiments, the additional aromatic epoxy resin is selected from the group consisting of: bisphenol-F diglycidyl ether, bisphenol-A diglycidyl ether, epoxidized phenol novolac resins, epoxidized cresol novolac resins, polycyclic epoxy resins, naphthalene diepoxides, and combinations thereof. In some embodiments, the composition is capable of undergoing a B-stageable cure. In certain embodiments, the composition of is capable of being cured by a photoinitiated event, e.g. by visible light- or ultraviolet-light. In certain embodiments, the composition has a pot-life (i.e., working life) of at least approximately 3 months at approximately 23° C. In other embodiments, the composition has a chlorine content of less than approximately 1000 ppm. In still other embodiments, the composition has an overall halogen content of less than approximately 2000 ppm. In certain embodiments, the composition has an oxygen permeability of less than approximately 0.4 cm$^3$·mm/m$^2$·atm·day at approximately 0% relative humidity and approximately 23° C. In some embodiments, the composition is substantially 100% solids, the composition is substantially solvent-free, and the composition has substantially no volatile organic chemicals.

In some embodiments of this composition, the composition comprises an amine curing agent capable of effectuating a thermal latent cure. In certain embodiments, the amine curing agent selected from the group consisting of: an aromatic amine curing agent, dicyandiamide, boron trifluoride amine complexes, and combinations thereof. In other embodiments, the composition comprises an accelerant capable of reducing the time or temperature of the thermal latent cure. In still other embodiments, the accelerant is selected from the group consisting of: phenyl ureas, imidazoles, boron trichloride amine complexes, aliphatic bis ureas, meta-substituted phenols, resorcinol, phloroglucinol, and combinations thereof. In yet other embodiments, the oxygen barrier composition comprises a filler selected from the group consisting of: platelet-type fillers, reinforcing-type fillers (such as glass fibers or other structural components), alumina-type fillers, and silica-type fillers, boron nitride, and combinations thereof.

In one particular embodiment, the oxygen barrier composition comprises between approximately 10% by weight and approximately 40% by weight of a total resin weight of resorcinol diglycidyl ether or an oligomer or adduct thereof; between approximately 10% by weight and approximately 80% by weight of the total resin weight of an additional aromatic epoxy resin; between 0% by weight and approximately 80% by weight of a filler (wherein the percent by weight of the filler is calculated by the filler weight divided by the combined total resin and filler weight) selected from the group consisting of: platelet-type fillers, reinforcing-type fillers (such as glass fibers or other structural components), alumina-type fillers, and silica-type fillers, boron nitride, and combinations thereof; between approximately 0.1 phr and approximately 40 phr of an amine curing agent capable of effectuating a thermal latent cure, the amine curing agent selected from the group consisting of: aromatic amine curing agents, dicyandiamide, boron trifluoride amine complexes, and combinations thereof; and between approximately 0.1 phr and approximately 40 phr of an accelerant capable of reducing the time or temperature of the thermal cure; wherein the chlorine content is less than approximately 900 ppm and the overall halogen content is less than approximately 1500 ppm.

In another embodiment, the oxygen barrier composition comprises approximately 25% by weight of the total resin weight resorcinol diglycidyl ether or an oligomer or adduct thereof; approximately 75% by weight of the total resin weight bisphenol-F epoxy resin; approximately 5 phr dicyandiamide; and approximately 5 phr 4,4' methylene bis(phenyl dimethyl urea).

In still another embodiment, a method of coating an electrical device with an oxygen barrier composition comprises providing an oxygen barrier composition and an electrical device having first and second components. In some embodiments, the method comprises heating the oxygen barrier composition to commence curing the composition. In other embodiments, the method comprises cooling the composition prior to completion of the curing, wherein a partially cured coating is formed. In yet other embodiments, the method comprises applying the partially cured coating to the first component of the electrical device. In still other embodiments, the method comprises soldering the first component of the electrical device to the second component of the electrical device, wherein the partially cured coating is fully cured during the soldering.

In some embodiments of this method, the oxygen barrier composition comprises a meta-substituted aromatic resin selected from the group consisting of: meta-substituted resorcinol epoxy resins, meta-substituted acrylic resorcinol resins, meta-substituted methacrylic-resorcinol resins, meta-substituted tetraglycidyl xylenediamine resins, resorcinol, and combinations thereof. In other embodiments, the meta-substituted aromatic resin is resorcinol diglycidyl ether or an oligomer thereof. In still other embodiments, the composition comprises an amine curing agent selected from the group consisting of: aromatic amine curing agents, dicyandiamide, boron trifluoride amine complexes, and combinations thereof. In yet other embodiments, the method comprises providing an accelerant capable of reducing time or temperature of the heating. In some embodiments, the accelerant is selected from the group consisting of: phenyl ureas, imidazoles, boron trichloride amine complexes, aliphatic bis ureas, meta-substituted phenols, resorcinol, phloroglucinol, and combinations thereof.

In another embodiment, a method of curing an oxygen barrier composition comprises providing an oxygen barrier composition selected from the group consisting of: meta-substituted acrylic resorcinol resins, meta-substituted methacrylic-resorcinol resins, and combinations thereof. The method further comprises providing a free-radical photoinitiator curing agent. In some embodiments, the method comprises applying ultraviolet radiation to the composition, creating a partially cured composition, wherein the composition undergoes free-radical polymerization.

In other embodiments of this method, the free-radical photoinitiator curing agent is selected from the group consisting of: alkyl ethers of benzoin, benzyl dimethyl ketal, 2-hydroxy-2-methylphenol-1-propanone, 2,2-diethoxyacetophenone, 2-benzyl-2-N,N-dimethylamino-1-(4-morpholinophenyl)butanone, halogenated acetophenone derivatives, sulfonyl chlorides of aromatic compounds, acylphosphine oxides and bis-acyl phosphine oxides, benzimidazoles, benzophenone, diphenoxy benzophenone, halogenated and amino functional benzophenones, fluorenone derivatives, anthraquinone derivatives, zanthone derivatives, thiozanthone derivatives, camphorquinone, benzil, and combinations thereof.

In yet another embodiment, a method of curing an oxygen barrier composition comprises providing an oxygen barrier composition having a resorcinol epoxy resin and a meta-substituted acrylic resorcinol resin, meta-substituted methacrylic-resorcinol resin, or combination thereof. The method further comprises providing a free-radical photoinitiator curing agent and a thermal curing agent. In some embodiments, the method comprises applying ultraviolet radiation to the composition, creating a partially cured composition, wherein the meta-substituted acrylic resorcinol resin, meta-substituted methacrylic-resorcinol resin, or combination thereof undergoes free-radical polymerization and the resorcinol epoxy resin remains substantially unpolymerized. In certain embodiments, the method further comprises heating the partially cured composition, wherein the resorcinol epoxy resin is cured, therein producing a fully cured composition. In some embodiments, the thermal curing agent is an amine curing agent selected from the group consisting of: aromatic amine curing agents, dicyandiamide, boron trifluoride amine complexes, and combinations thereof.

DETAILED DESCRIPTION

As used herein, terms such as "typically" are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

As used herein, an "A-stage" or "A-staged" physical state is characterized by a composition with a linear structure, solubility, and fusibility. In certain embodiments, the A-staged composition may be a high viscosity liquid, having a defined molecular weight, and comprised of largely unreacted compounds. In this state, the composition will have a maximum flow (in comparison to a B-staged or C-staged material). In certain embodiments, the A-staged composition may be changed from an A-staged state to either a B-staged state or a C-staged state via either a photo-initiated reaction or thermal reaction.

As used herein, a "B-stage" or "B-staged" physical state is achieved by partially curing an A-stage material, wherein at least a portion of the A-stage composition is crosslinked, and the molecular weight of the material increases. Unless indicated otherwise, B-stageable compositions can be achieved through either a thermal latent cure or a UV-cure. In certain embodiments, the B-stageable composition is effectuated through a thermal latent cure. B-staged reactions can be arrested while the product is still fusible and soluble, although having a higher softening point and melt viscosity than before. The B-staged composition contains sufficient curing agent to effect crosslinking on subsequent heating. In certain embodiments, the B-stage composition is fluid, or semi-solid, and, therefore, under certain conditions, can experience flow. In the semi-solid form, the thermosetting polymer may be handled for further processing by, for example, an operator. In certain embodiments, the B-stage composition comprises a conformal tack-free film, workable and not completely rigid, allowing the composition to be molded or flowed around an electrical device.

As used herein, a "C-stage" or "C-staged" physical state is achieved by fully curing the composition. In some embodiments, the C-staged composition is fully cured from an A-staged state. In other embodiments, the C-staged composition is fully cured from a B-staged state. Typically, in the C-stage, the composition will no longer exhibit flow under reasonable conditions. In this state, the composition may be solid and, in general, may not be reformed into a different shape.

In developing improved oxygen barrier compositions for electrical devices, the inventors have discovered that the improved oxygen barrier composition may comprise various properties and features such as crystalline domains, high density, close chain packing, low free volume, hydrogen bonding and other polar interactions, aromatic groups to block oxygen, and/or meta-substitution on the aromatic groups for optimized polymer chain packing. In particular, the inventors have discovered meta-substituted aromatic resin compositions with improved pot-life (working-life), low halogen concentrations, ability for B-stageable curing, and substantially free of VOCs. These resin composition properties are in addition to having high oxygen barrier properties, excellent chemical resistance, flexibility, multiple viscosities, and excellent adhesion to a variety of substrates. In certain embodiments, the meta-substituted aromatic resins are selected from the group consisting of: meta-substituted resorcinol epoxy resins, meta-substituted acrylic resorcinol resins, meta-substituted methacrylic-resorcinol resins, meta-substituted xylenediamine resins, resorcinol, and combinations thereof. In one embodiment, the meta-substituted aromatic resin is a meta-substituted resorcinol epoxy resin. In another embodiment, the meta-substituted aromatic resin is a meta-substituted acrylic resorcinol resin, meta-substituted methacrylic-resorcinol resin, or combination thereof. In still another embodiment, the meta-substituted aromatic resin is a tetraglycidyl xylenediamine resin.

In certain embodiments, meta-substituted resorcinol resins in the oxygen barrier composition have the general structure (I):

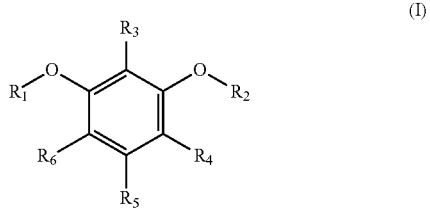

(I)

wherein the general structure includes oligomers thereof.

In some embodiments, $R_1$ and $R_2$, including or joined to the —O— linking group, each independently form a curable functionality selected from the group consisting of glycidyl (such as glycidyl ether), aliphatic epoxy, acrylic (such as acrylate), methacrylic (such as methacrylate), itaconate, cycloaliphatic epoxy, hydroxyl, vinyl ether, propenyl ether, crotyl ether, styrenic, maleimide, maleate, fumarate, cinnamate, acrylamide, methacrylamide, chalcone, thiol, allyl, alkynyl, alkenyl, and cycloalkenyl groups. In certain embodiments, $R_1$ and $R_2$ are the same.

In certain embodiments, $R_3$, $R_4$, $R_5$, and $R_6$ are independently selected from the group consisting of: hydrogen, alkyl, vinyl, acrylic, methacrylic, aryl, substituted alkyl, substituted aryl, halogen, and cyano groups. In other embodiments, in addition to the groups discussed above, $R_3$, $R_4$, $R_5$, and $R_6$ may also be independently selected from the groups discussed for $R_1$ and $R_2$.

In one embodiment, the meta-substituted resorcinol epoxy resin is a resorcinol diglycidyl ether resin having the general structure (II) below:

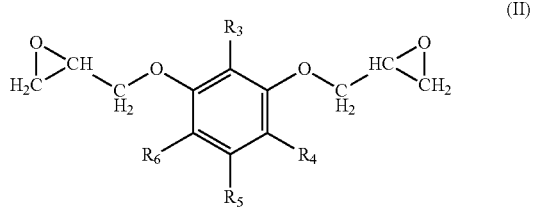

(II)

In one embodiment, the meta-substituted resorcinol epoxy resin is resorcinol diglycidyl ether (RDGE) (where $R_3$, $R_4$, $R_5$, and $R_6$ in (II) are hydrogen). RDGE has good oxygen barrier properties, as well as good chemical resistance, flexibility, and adhesion to a variety of substrates. RDGE also features low viscosity (approximately 200-500 cps at 25° C.), which allows for flexibility in the oxygen barrier composition formulation, such as the addition of highly viscous epoxy components, fillers, or thixotropes. RDGE-based resins may provide advantageous conformer packing, improved hydrogen bonding, and inter/intra-chain interaction within the resin in comparison to other epoxy resins.

In a particular embodiment, the RDGE resin is ERISYS™ RDGE-H, a purified form of RDGE, available from CVC Thermoset Specialties Division of Emerald Performance Materials, Cuyahoga Falls, Ohio, USA. RDGE-H has a viscosity of about 200-325 cps at 25° C. and approximately 2300-2500 ppm chlorine.

In additional embodiments, the RDGE resin may have substitutions for hydrogen at the $R_3$, $R_4$, $R_5$, and/or $R_6$ positions, as well as at any hydrogen position on either glycidyl ether.

In additional embodiments, the RDGE resin may be oligomerized, as shown in the structure (III) below:

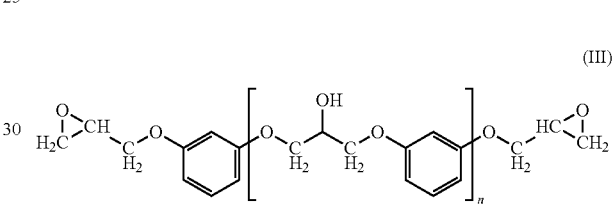

(III)

wherein n=1, 2, 3, or greater. As n increases, the viscosity of the composition increases as well. In certain embodiments, a higher, more viscous oligomer or adduct may be used for a high viscosity application, such as a pre-preg preparation. In certain embodiments, a workable composition has a viscosity between approximately 200 and approximately 50,000 cps; between approximately 200 cps and approximately 10,000 cps; or between approximately 200 cps and approximately 1000 cps. In certain embodiments, the value of n should not be so large that the viscosity is above approximately 50,000 cps; approximately 10,000 cps; or approximately 1000 cps.

Additionally, in another embodiment, the meta-substituted aromatic resin is a meta-substituted acrylic resorcinol resin, meta-substituted methacrylic-resorcinol resin, or combination thereof, including oligomers or adducts thereof, such as the resorcinol epoxy acrylate structure (IV) shown below:

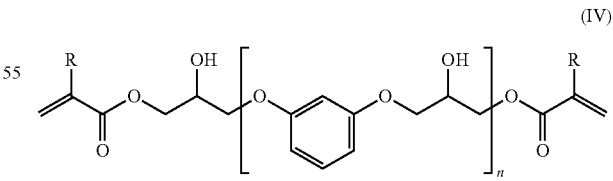

(IV)

wherein n=0, 1, 2, 3, or greater. As n increases, the viscosity of the composition increases as well. In certain embodiments, a workable composition has a viscosity between approximately 200 and approximately 50,000 cps; between approximately 200 cps and approximately 10,000 cps; or between approximately 200 cps and approximately 1000 cps. In certain embodiments, the value of n should not be so large that the viscosity is above approximately 50,000 cps; approximately 10,000 cps; or approximately 1000 cps.

In one embodiment, the meta-substituted acrylic resorcinol resin, meta-substituted methacrylic-resorcinol resin, or combination thereof comprises a resorcinol-type epoxyacrylate such as NEOPOL 8312 or NEOPOL 8313, supplied by Japan U-PiCA Co., Tokyo, Japan.

In some embodiments, the meta-substituted aromatic resin is tetraglycidyl xylenediamine, including oligomers or adducts thereof, having the structure shown below:

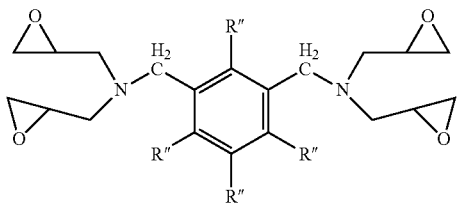

wherein R" may independently comprise any substitution. In one embodiment, each R" is hydrogen, and the tetraglycidyl xylenediamine resin is N,N,N',N'-tetraglycidyl-m-xylenediamine. Commercial examples are available as TETRAD-X from Mitsubishi Gas Chemical Co., Tokyo, Japan or ERISYS™ GA-240 from CVC Thermoset Specialties Division of Emerald Performance Materials, Cuyahoga Falls, Ohio, USA.

In certain embodiments, the amount of the meta-substituted aromatic resin in the oxygen barrier composition can range between approximately 1% by weight and approximately 100% by weight, between approximately 5% by weight and approximately 50% by weight, between approximately 10% by weight and approximately 40% by weight, or between approximately 20% by weight and 30% by weight, wherein "% by weight" is defined in terms of the total resin weight in the oxygen barrier composition, unless noted otherwise. In still another embodiment, the amount of meta-substituted aromatic resin is approximately 25% by weight of the total weight of resin present in the composition.

In some embodiments, the properties of the oxygen barrier composition are adjusted, such as reducing the halogen content (e.g., the chlorine content), increasing the viscosity, or increasing the glass transition temperature ($T_g$) of the oxygen barrier composition by adding additional component(s) to the composition. In one embodiment, an aromatic epoxy resin is added to the meta-substituted aromatic resin-containing barrier composition. In one embodiment, the aromatic epoxy resin is selected from the group consisting of: bisphenol-F diglycidyl ether, N,N,N',N'-tetraglycidyl-m-xylenediamine (such as TETRAD-X from Mitsubishi Gas Chemical Co. or ERISYS™ GA-240 from CVC Thermoset Specialties Division of Emerald Performance Materials), bisphenol-A diglycidyl ether, epoxidized phenol novolac resins, epoxidized cresol novolac resins, polycyclic epoxy resins, naphthalene diepoxides, and combinations thereof. In certain embodiments, the aromatic epoxy resin has a low chlorine content of less than approximately 900 ppm. In one embodiment, the aromatic epoxy resin comprises bisphenol-F diglycidyl ether, which has strong oxygen barrier properties and low chlorine content. JER Y983U, a bisphenol-F having approximately 300 ppm Cl, is available from Japan Epoxy Resins Co., Tokyo, Japan.

In another embodiment, the aromatic epoxy resin is a naphthalene diglycidyl ether which complements the meta-substituted aromatic resin, offering high chemical resistance, high glass transition temperature, and good oxygen barrier properties. One source of a naphthalene diglycidyl ether is EPICLON® HP-4032D, containing approximately 900 ppm chlorine, from DIC Japan, Tokyo, Japan.

In certain embodiments, the addition of the aromatic epoxy resin reduces the chlorine and/or overall halogen content in the oxygen barrier composition, assisting in the reduction of toxic halogenated by-products, such as dioxin and furans, upon disposal or recycling by incineration or burning of electronic components. In some embodiments, the addition of the aromatic epoxy resin reduces the chlorine content to less than approximately 2000 ppm, less than approximately 1500 ppm, less than approximately 1000 ppm, or less than approximately 900 ppm. In some embodiments, the addition of the aromatic epoxy resin to the meta-substituted aromatic resin results in an overall halogen content of less than approximately 2000 ppm, less than approximately 1500 ppm, less than approximately 1000 ppm, or less than approximately 900 ppm. In one embodiment, the chlorine content is reduced below approximately 1000 ppm and the overall halogen content is reduced below approximately 2000 ppm. In another embodiment, the chlorine content is reduced below approximately 900 ppm and the overall halogen content is reduced below approximately 1500 ppm. In one embodiment, the combination of RDGE and the aromatic epoxy resin results in a reduced chlorine level of less than approximately 900 ppm with substantially no bromine detected (e.g., less than 10 ppm bromine).

In certain embodiments, the addition of the aromatic epoxy resin increases the glass transition temperature ($T_g$) upwards of approximately 150° C. In other embodiments, the addition increases $T_g$ to approximately 160° C. or greater. In other embodiments, the addition increases $T_g$ by approximately 10° C. to approximately 60° C. Considerations of the glass transition temperature for the composition are important for PPTC devices in particular. PPTC devices can expand upwards of 10% during use. As the device warms during use, it reaches a certain "trip temperature" at which the device begins expanding. To allow for expansion, it is generally recommended that $T_g$ for the oxygen barrier composition encapsulating or covering the PPTC device be equal to or less than the trip temperature of the device, allowing the device to expand more readily due to the barrier composition being in a more rubbery state at the trip temperature. Desirable oxygen barrier compositions also maintain their barrier properties in this rubbery state. The inventors have discovered that these oxygen barrier compositions can maintain their properties.

The amount of aromatic epoxy resin added to the oxygen barrier composition can be varied based upon the oxygen barrier properties desired, such as oxygen permeability, halogen content, and viscosity. In certain embodiments, the amount of aromatic epoxy resin in the oxygen barrier composition ranges between 0% by weight and approximately 99% by weight of the total resin weight in the oxygen barrier composition. In other embodiments, the amount is between approximately 1% by weight and approximately 80% by weight of the total resin weight. In other embodiments, the amount is between approximately 1% by weight and approximately 25% by weight of the total resin weight. In one embodiment, the amount of aromatic epoxy resin in the oxygen barrier composition is approximately 75% by weight of the total resin weight.

In other embodiments, the ratio of meta-substituted aromatic resin (e.g., RDGE) to the aromatic epoxy resin (e.g., a bisphenol-F epoxy resin) is between approximately 1:10 and approximately 10:1. In other embodiments, the ratio is between approximately 1:5 and approximately 5:1. In other embodiments, the ratio is between approximately 1:2 and approximately 2:1. In other embodiments, the ratio of meta-substituted aromatic resin (e.g., RDGE) and the aromatic epoxy resin (e.g., bisphenol-F) is approximately 1:1.

In addition to adding an aromatic epoxy resin to the meta-substituted aromatic resin, or in the alternative of adding an aromatic epoxy resin, the oxygen barrier composition can include a variety of fillers, such as platelet-type fillers, reinforcing-type fillers (such as glass fibers or other structural components), alumina-type fillers, and silica-type fillers, boron nitride, or other suitable filler. These fillers may be used to adjust the oxygen barrier composition properties, such as decreasing halogen levels (e.g., chlorine levels), increasing viscosity, decreasing shrinkage in the cured resin, or increasing the barrier properties by presenting a tortuous path. In some embodiments, a silica filler can be added to the composition, in part to help reduce the overall chlorine or overall halogen content without an appreciable increase in viscosity. One example of a silica filler is FB-5D fused silica filler available from Denka, Tokyo, Japan. In another embodiment, a filler may increase viscosity for easier application and less running. A silica filler of this type is CAB-O-SIL TS-720, available from Cabot Corp., Boston, Mass., USA.

In certain embodiments, the filler comprises a platelet-type filler, such as platelet silicas (such as ground mica), flaked glass, chemically modified silacious minerals such as organoclays, or combinations thereof. In one embodiment, the platelet-type filler is an organoclay filler. One example of an organoclay filler is Cloisite 10A from Southern Clay Products, Gonzales, Tex., USA. Additional, typical platelet-type fillers for oxygen barrier compositions are disclosed in U.S. Pat. No. 5,840,825, herein incorporated by reference.

Like the amount of aromatic epoxy resin added to the oxygen barrier composition, the amount of filler can be varied based upon the oxygen barrier properties desired, such as oxygen permeability, chlorine content, viscosity, reduced epoxy usage (i.e., cost of manufacturing). Because these fillers have substantially no halogen/chlorine content, the weight percent of filler added can correlate directly with reduction in chlorine ppm levels. For example, adding approximately 25% by weight filler to the composition may reduce the overall chlorine content by approximately 25% (wherein the percent by weight filler in the composition is defined in terms of the combined weight of resin and filler, excluding any curing agent or accelerant in the composition). In addition, the filler may increase the overall viscosity of the oxygen barrier composition. For example, the addition of a small amount (approximately 2% by weight) of CAB-O-SIL TS-720 to a RDGE/aromatic epoxy composition can increase the overall viscosity 10-fold (e.g., from about 1000 cps to about 10,000 cps). Therefore, the amount of filler added may be varied based upon the desired composition properties. In certain embodiments, the amount of filler is between approximately 0.1% by weight and approximately 80% by weight filler/combined resin and filler. In other embodiments, the amount is between approximately 1% by weight and approximately 50% by weight filler/combined resin and filler. In other embodiments, the amount is between approximately 20% by weight and approximately 80% by weight filler/combined resin and filler.

In addition to aromatic epoxy resins and/or fillers, a particular curing agent (i.e., initiator) can be added to the oxygen barrier composition to improve the oxygen barrier properties and the ease of cure. As discussed in greater detail below, the addition of a particular curing agent to the barrier composition can be helpful for: (i) thermal latent curing for encapsulation and/or pre-preg manufacture (i.e., "B-stage" curing), (ii) complete curing in one step, and/or (iii) complete curing at the solder reflow step. In certain embodiments, the curing agent is an amine curing agent. Amine curing agents may assist in providing good oxygen barrier properties to a resin composition in multiple ways. For example, it is believed that the polarity and hydrogen bonding ability of the nitrogen molecules provides denser packing by inter/intra chain interactions. Additionally, amine curing agents that possess multiple active hydrogen atoms on the nitrogen atom may produce branched and cross-linked structures that are denser, and therefore may provide improved oxygen blocking ability. Another notable feature among some amine curing agents is that they exhibit multiple thermal decomposition pathways that may yield dense and crosslinked structures that are improved over curing agents that form more linear ethereal chain structures during and after cure. Finally, amines have the ability to capture wet carbon dioxide and convert it to bicarbonate, further filling gaps in the oxygen barrier composition matrix and thus slowing down oxygen ingress.

In one embodiment, the amine curing agent is an aromatic amine curing agent. Aromatic amine curing agents comprise compounds that have a nitrogen group directly attached to an aromatic group, such as the non-limiting example of a meta-substituted aromatic amine shown below in structure (V):

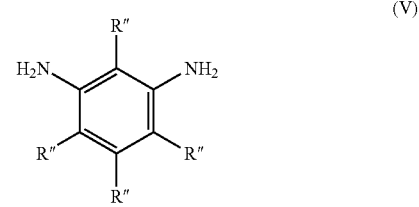

(V)

wherein each R" may independently comprise any substitution (such as hydrogen, alkyl groups, and other suitable groups). Ortho- and para-substituted aromatic amines are also possible. In certain embodiments, meta-substituted aromatic amines are chosen for their oxygen barrier properties.

In an additional embodiment, the amine curing agent comprises an aromatic-substituted amine curing agent, wherein that the compound has a nitrogen group linked through a connector (such as an alkyl group) to the aromatic group, wherein the connector can be approximately 20 atom spacers (R' below) or less (such as $CH_2$, O, N, and other suitable spacers). A non-limiting example of a aromatic-substituted amine curing agent is shown below in structure (VI):

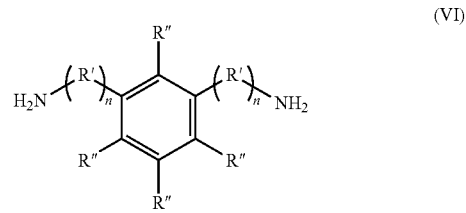

(VI)

wherein both R' groups independently function as at least one spacer atom between the aromatic substituent and nitrogen, each R" may independently comprise any substitution (such as hydrogen, alkyl groups, etc.), and n is any integer of 1 or greater. Ortho- and para-substituted amines are also possible. In certain embodiments, meta-substituted amines are used. In some embodiments, n is an integer between 1 and 20. In one embodiment, an aromatic-substituted amine curing agent is meta-xylenediamine.

In one particular embodiment, the aromatic amine curing agent is a diaminodiphenyl sulfone. One commercial example is OMICURE™ 33DDS, a 3,3'-diaminodiphenyl sulfone, available from CVC Thermoset Specialties Division of Emerald Performance Materials, Cuyahoga Falls, Ohio, USA.

In one embodiment, the aromatic amine is a meta-substituted aromatic amine such as meta-phenylenediamine, 3,3'-diaminodiphenyl sulfone, 4,4'-diaminodiphenyl sulphone, melamine, and the like, and combinations thereof.

In certain embodiments, the amount of aromatic amine curing agent included in the oxygen barrier composition is based upon the amount of resorcinol epoxy resins and other aromatic epoxy resins present in the composition, as the active hydrogens present in the aromatic amines will react with a stoichiometric number of epoxy groups. In some embodiments, the amount of aromatic amine curing agent is within a 10% or 20% stoichiometric amount of the resorcinol/aromatic epoxy resins.

In other embodiments, the curing agent is an anhydride curing agent. In one particular embodiment, the anhydride curing agent is an aromatic anhydride curing agent. An example of an anhydride curing agent is phthalic anhydride.

In certain embodiments, the curing agent is a thermal curing agent capable of either (i) a one-time, full cure (i.e., A-stage to C-stage cure), (ii) a B-stage cure, and/or (iii) a complete cure of a B-stage composition at the solder reflow step. In certain embodiments, the curing agent is selected from dicyandiamide (DICY), dihydrazide compounds, aromatic amines, boron trifluoride-amine complex, and combinations thereof. In one embodiment, the curing agent comprises DICY. One commercial example of DICY is OMICURE® DDA 5, available from CVC Thermoset Specialties Division of Emerald Performance Materials, Cuyahoga Falls, Ohio, USA.

In certain embodiments, the curing agent may be a visible light-curing agent or ultraviolet-curing agent. In these embodiments, the purpose of the curing agent is to initiate polymerization of the meta-substituted aromatic resin when exposed to light- or UV-radiation. In certain embodiments, the light-curing agent or UV-curing agent is coupled with a meta-substituted acrylic resorcinol resin, meta-substituted methacrylic-resorcinol resin, or combination thereof. In some embodiments, the light- or ultraviolet-curing agent is a free-radical photoinitiator. Free-radical photoinitiators useful for meta-substituted acrylic resorcinol resins and meta-substituted methacrylic-resorcinol resins (such as resorcinol epoxy acrylate or resorcinol epoxy methacrylate) include, but are not limited to, photofragmentation photoinitiators and electron transfer photoinitiators. Non-limiting examples include: alkyl ethers of benzoin, benzyl dimethyl ketal, 2-hydroxy-2-methylphenol-1-propanone, diethoxyacetophenone, 2-benzyl-2-N,N-dimethylamino-1-(4-morpholinophenyl) butanone, halogenated acetophenone derivatives, sulfonyl chlorides of aromatic compounds, acylphosphine oxides and bis-acyl phosphine oxides, benzimidazoles, benzophenone, diphenoxy benzophenone, halogenated and amino functional benzophenones, Michler's ketone, fluorenone derivatives, anthraquinone derivatives, zanthone derivatives, thioxanthone derivatives, camphorquinone, benzil, dimethyl ethanolamine, thioxanthen-9-one derivatives, acetophenone quinone, methyl ethyl ketone, valero-phenone, hexanophenone, gamma-phenylbutyrophenone, p-morpholinopropiophenone, dibenzosuberone, 4-morpholinobenzophenone, 4-morpholinodeoxybenzoin, p-diacetylbenzene, 4-aminobenzophenone, benzaldehyde, alpha-tetraline, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9-one, 7-H-benz[de]-anthracen-7-one, 1-naphthaldehyde, 4,5'-bis(dimethylamino)-benzophenone, fluorene-9-one, 1'-acetonaphthone, 2'-acetonaphthone, 2,3-butanedione, and combinations thereof. Commercial examples include: Ciba IRGACURE® 651, a benzyldimethyl-ketal, from Ciba, Tarrytown, N.Y., USA; Additol BCPK, a benzophenone phenyl ketone eutectic, from Cytec Industries, West Paterson, N.J., USA; and Ciba IRGACURE®, a phosphine oxide, from Ciba, Tarrytown, N.Y., USA.

Regarding the amount of curing agent that may be added to the oxygen barrier composition, the amount added is generally described in parts of curing agent per hundred parts of total resin present in the oxygen barrier composition ("phr"). In certain embodiments, the amount is between approximately 0.1 phr and approximately 40 phr (i.e., 40 grams curing agent per 100 grams total resin); approximately 0.1 phr and approximately 5 phr; or approximately 10 phr and approximately 40 phr. In one embodiment, the amount of curing agent is approximately 5 phr (i.e., 5 grams curing agent per 100 grams total resin).

In certain embodiments, where the curing agent is a light- or UV-curing agent, the amount of curing agent added is between approximately 0.1 phr and approximately 5 phr.

In certain embodiments, an accelerant may be added to speed up the curing process or reduce the temperature for the thermal latent cure or one-time cure. In certain embodiments, the accelerant is added in combination with a curing agent. In certain embodiments, the amount of accelerant is between approximately 0.1 phr and approximately 40 phr; between approximately 0.1 and approximately 5 phr; or between approximately 10 phr and approximately 40 phr. In one embodiment, the amount of accelerant is approximately 5 phr.

Various thermal curing accelerants are known in the art, including phenyl ureas, boron trichloride amine complexes, imidazoles, aliphatic bis ureas, phenols, resorcinol, and combinations thereof. In one embodiment, an effective accelerant for the oxygen barrier composition is a phenyl urea, where the phenyl urea has a nitrogen content that may further assist in providing good oxygen barrier properties via denser packing and inter/intra chain interaction. Non-limiting examples of phenyl urea accelerants include: phenyl dimethyl urea, 4,4' methylene bis(phenyl dimethyl urea), 2,4' toluene bis(dimethyl urea), and combinations thereof. A commercial example of phenyl dimethyl urea is OMICURE™ U-405 or U-405M, available from Thermoset Specialties Division of Emerald Performance Materials, Cuyahoga Falls, Ohio, USA. A commercial example of 4,4' methylene bis(phenyl dimethyl urea) is OMICURE™ U-52 or U-52M. A commercial example of 2,4' toluene is OMICURE™ U-24 or U-24M. In another embodiment, the accelerant is a boron trichloride amine complex, available as OMICURE™ BC-120. In another embodiment, the accelerant is 2-ethyl-4-methyl imidazole, available as OMICURE™ 24 EMI. In another embodiment, the accelerant is an aliphatic bis urea, available as OMICURE™ U-35 or U-35M.

In another embodiment, a meta-substituted phenol can be used as an accelerator when coupled with an aromatic epoxy resin and DICY. In one embodiment, the phenol is resorcinol. In another embodiment, the phenol is phloroglucinol. The use of a meta-substituted phenol, such as resorcinol, as the accelerator may be advantageous as it introduces an additional meta-substituted aromatic resin into the resin matrix and may further enhance the oxygen barrier properties.

In one embodiment, the combination of DICY and a phenyl urea accelerant provides high amine content for polarity and enhanced barrier properties as well as multi-functional sites for crosslinking and branching. In one embodiment, DICY is combined with a phenyl dimethyl urea. In one embodiment, DICY is combined with a 4'4 methylene bis(phenyl dimethyl urea). In another embodiment, DICY is combined with a 2,4' toluene bis(dimethyl urea). In another embodiment, DICY is combined with an aliphatic bis urea (OMICURE™ U-35 or U-35M in particular).

In one embodiment, the oxygen barrier composition comprises a meta-substituted aromatic resin (e.g., RDGE) ranging between approximately 1% by weight and approximately 100% by weight of the composition and optionally, at least one of: (i) an aromatic epoxy resin (e.g., bisphenol-F) ranging between approximately 0.1% by weight and approximately 99% by weight; (ii) a filler (e.g., an alumina, silica, or platelet-like filler) ranging between approximately 0.1% by weight and approximately 80% by weight; (iii) a curing agent (e.g., DICY or an aromatic amine curing agent) ranging between approximately 0.1 phr and approximately 40 phr; and (iv) an accelerant (e.g., a phenyl urea) used jointly with the curing agent, and ranging between approximately 0.1 phr and approximately 40 phr.

In another embodiment, the oxygen barrier composition comprises a resorcinol-based resin (e.g., RDGE) ranging between approximately 10% by weight and approximately 40% by weight of the total weight of resin; an aromatic epoxy resin (e.g., bisphenol-F) ranging between approximately 10% by weight and approximately 80% by weight of the total weight of resin; a filler (e.g., an alumina, silica, or platelet-like filler) ranging between approximately 0% by weight and approximately 80% by weight filler/combined resin and filler; an amine curing agent (e.g., DICY) ranging between approximately 0.1 phr and approximately 40 phr; and an accelerant (e.g., a phenyl urea) used jointly with the curing agent, and ranging between approximately 0.1 phr and approximately 40 phr.

In one embodiment, the oxygen barrier composition comprises approximately 25% by weight of total resin weight RDGE, approximately 75% by weight of total resin weight bisphenol-F aromatic epoxy resin, approximately 5 phr DICY as the amine curing agent, and approximately 5 phr phenyl urea accelerant.

Various physical or performance-based properties may be targeted with the oxygen barrier composition, prompting the choice of using certain components in certain amounts. For example, the oxygen barrier composition may have a targeted chlorine or overall halogen content, low viscosity, high oxygen barrier, certain solids content (i.e., limited amounts of solvents or VOCs), excellent chemical resistance, flexibility in working the barrier coating around an electronic device, and excellent adhesion to a variety of substrates.

In certain embodiments, the oxygen barrier composition has a chlorine content below approximately 2000 ppm; approximately 1500 ppm; approximately 1000 ppm; or approximately 900 ppm. In another embodiment, the oxygen barrier composition has a chlorine content below approximately 1500 ppm. In some embodiments, the oxygen barrier composition has an overall halogen content (bromine and chlorine combined) below approximately 2000 ppm; approximately 1500 ppm; approximately 1000 ppm; or approximately 900 ppm.

In certain embodiments, low viscosity for ease in application is a desirable property. In one embodiment, the viscosity of the oxygen barrier composition is between approximately 200 and approximately 50,000 cps. In another embodiment, the viscosity is between approximately 200 and approximately 10,000 cps. In another embodiment, the viscosity is between approximately 200 and approximately 1000 cps.

In certain embodiments, the oxygen barrier composition may have targeted high barrier properties for oxygen. In one embodiment, the oxygen permeability of the composition is less than approximately 0.4 $cm^3 \cdot mm/m^2 \cdot atm \cdot day$ (1 $cm^3 \cdot mil/100\ in^2 \cdot atm \cdot day$), measured as cubic centimeters of oxygen permeating through a sample having a thickness of one millimeter over an area of one square meter. The permeation rate is measured over a 24 hour period, at 0% relative humidity, and a temperature of 23° C. under a partial pressure differential of one atmosphere). Oxygen permeability may be measured using ASTM F-1927 with equipment supplied by Mocon, Inc., Minneapolis, Minn., USA. Unless defined otherwise, the oxygen permeability is based on a measurement at approximately 0% relative humidity.

In some embodiments, the oxygen permeability of the composition is less than 0.1 $cm^3 \cdot mm/m^2 \cdot atm \cdot day$; approximately 0.05 $cm^3 \cdot mm/m^2 \cdot atm \cdot day$; or approximately 0.01 $cm^3 \cdot mm/m^2 \cdot atm \cdot day$.

In certain embodiments, the oxygen barrier composition has a solids content of greater than approximately 90% by weight of the total oxygen barrier composition. In other embodiments, the solids content is greater than approximately 95% by weight of the composition. In other embodiments, the oxygen barrier composition is substantially solvent-free (i.e., less than approximately 1% by weight solvent in the total composition, or near 100% by weight solids in the total composition), having substantially no volatile organic compounds (i.e., having less than 1% by weight VOCs in the total composition).

The oxygen barrier composition gel time may also be a parameter of interest. The gel time is the time it takes from the beginning of mixing the components at a certain temperature (e.g., 171° C.) until the point at which the composition turns from a viscous liquid to an elastomer having memory. In certain embodiments, the gel time for the oxygen barrier composition is between approximately 150 seconds and approximately 250 seconds when mixed at approximately 171° C.

The various embodiments described herein may be used for a variety of electrical or other devices. In certain embodiments, the oxygen barrier composition is used in a circuit protection device, such as an over-current device or over-voltage device. In a particular embodiment, the oxygen barrier composition is used in a PPTC device, such as those defined in U.S. Pat. No. 7,371,459, herein incorporated by reference. Various PPTC devices include surface mount devices (SMDs) and battery strap devices. In certain embodiments, the oxygen barrier may encapsulate various SMDs, such as those described in U.S. patent application Ser. No. 12/460,349, filed contemporaneously with this application, entitled "Oxygen-Barrier Packaged Surface Mount Device," herein incorporated by reference. Based upon the particular electronic device being used, in certain embodiments, the thickness of the oxygen barrier composition may range between approximately 0.05-0.65 mm (2-25 mils).

The oxygen barrier compositions may be applied to the electrical device in a variety of forms. In one embodiment, the oxygen barrier composition can be applied as a coating or encapsulant to the electrical device. In particular, the oxygen barrier composition can encapsulate a SMD or battery strap device.

In another embodiment, the oxygen barrier composition can be applied to electrical device through B-stageable "pre-preg" sheets. For instance, the oxygen barrier composition can be applied to a fiberglass cloth (typically by soaking the cloth in the composition resin), followed by partially curing the fiberglass and oxygen barrier composition to a B-stage. The partially cured resin remains workable and not completely rigid, allowing the pre-preg to be molded or flowed around the electrical device, at which point the device can be fully cured (i.e., C-stage cure). In one embodiment, an electrical device (e.g., a PPTC device) can be laminated between the pre-preg sheets.

In another embodiment, the oxygen barrier composition can be applied to an electrical device as a partially cured, B-stage powder, pellet, tape, film, or pre-preg sheet. In some embodiments, the composition is applied as a powder coating, transfer molding, or sheet lamination. In one embodiment, the B-stage composition may be coated onto a backing of a substrate, such as an electrical device. In another embodiment, the B-stage composition can be electrostatically sprayed onto a substrate, e.g., electrical device. This may be a useful method of application for electrical devices such as R-line, telecom, or semiconductor packaging.

In certain embodiments, the oxygen barrier composition may have improved pot-life (shelf-life) at approximately 23° C. (i.e., room temperature) in comparison to known, two-part epoxy formulations, where the pot-life is approximately 6-24 hours at 23° C. In some embodiments, the pot-life of the oxygen barrier composition is at least approximately 3 months or at least approximately 6 months at approximately 23° C. In some embodiments, the pot-life of the oxygen barrier composition containing DICY as a curing agent is at least approximately 3 months or at least approximately 6 months at approximately 23° C. In another embodiment, the pot-life of the oxygen barrier composition containing DICY as a curing agent is between approximately 3 months and approximately 6 months at approximately 23° C. In some embodiments, the pot-life of the oxygen barrier composition is indefinite at 0° C.

The oxygen barrier composition may be cured through a number of different methods. In one embodiment, the composition is fully cured (i.e., C-stage cured) in a single thermal stage. The operating temperature for fully curing the composition may vary based upon certain variables including the constituents of the composition (i.e., if there is an accelerator or not) and the time held at the elevated temperature. In certain embodiments, with or without an accelerator, a one-time full cure can be accomplished at a temperature of between approximately 150° C. and approximately 260° C. for about 1-6 hours.

In another embodiment, the oxygen barrier composition can be partially-cured through a thermal latent, B-stage cure. As mentioned above, this partial cure method is useful for pre-pregs among other embodiments. The partially cured resin allows the oxygen barrier composition to form a conformal tack-free film, workable and not completely rigid, allowing the barrier composition to be molded or flowed around the electrical device. Operating temperatures for B-stage curing may vary based upon certain variables including the constituents of the composition (i.e., if there is an accelerator or not) and the time held at the elevated temperature. In certain embodiments, with or without an accelerator, the temperature of the partial cure can range between approximately 25° C. and approximately 150° C. for a time between approximately 5 minutes to several hours (e.g., between approximately 2-24 hours).

In certain embodiments, after partially curing the composition and applying the B-stage composition to the electrical device, the composition may be fully cured. In certain embodiments, the final cure can occur at elevated temperatures between approximately 125° C. and approximately 170° C. In another embodiment, the final cure of the B-stage composition is accomplished through solder reflow of the composition. Solder reflow typically occurs at elevated temperatures as high as approximately 260° C. The solder reflow step can be accomplished at the site of the initial cure and coating of the electrical device, or at some intermediate destination, or by the end-user. In one embodiment, the final cure is effectuated through a solder reflow step, wherein the oxygen barrier composition and electrical device are heated to approximately 260° C. In one embodiment, the soldering step accomplishes two goals at the same time, wherein both the barrier composition is fully cured and a first electrical component is soldered to a second electrical component at the same time.

In another curing embodiment, an oxygen barrier composition comprising a meta-substituted acrylic resorcinol resin, meta-substituted methacrylic-resorcinol resin, or combination thereof is curable by ultraviolet light. The UV cure may be accomplished with free-radical photoinitiators. The inventors have discovered that a free-radical cure may produce polymers with an improved oxygen barrier with stronger crosslinking and higher density over a cationic cure which may polymerize to form polyether structures with poor oxygen barrier properties.

Free-radical photoinitiators useful for meta-substituted acrylic resorcinol resins or meta-substituted methacrylic-resorcinol resins (such as resorcinol epoxy acrylate or resorcinol epoxy methacrylate) include, but are not limited to, photofragmentation photoinitiators and electron transfer photoinitiators. Non-limiting examples include: alkyl ethers of benzoin, benzyl dimethyl ketal, 2-hydroxy-2-methylphenol-1-propanone, diethoxyacetophenone, 2-benzyl-2-N,N-dimethylamino-1-(4-morpholinophenyl)butanone, halogenated acetophenone derivatives, sulfonyl chlorides of aromatic compounds, acylphosphine oxides and bis-acyl phosphine oxides, benzimidazoles, benzophenone, diphenoxy benzophenone, halogenated and amino functional benzophenones, Michler's ketone, fluorenone derivatives, anthraquinone derivatives, zanthone derivatives, thioxanthone derivatives, camphorquinone, benzil, dimethyl ethanolamine, thioxanthen-9-one derivatives, acetophenone quinone, methyl ethyl ketone, valero-phenone, hexanophenone, gamma-phenylbutyrophenone, p-morpholinopropiophenone, dibenzosuberone, 4-morpholinobenzophenone, 4-morpholinodeoxybenzoin, p-diacetylbenzene, 4-aminobenzophenone, benzaldehyde, alpha-tetraline, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9-one, 7-H-benz[de]-anthracen-7-one, 1-naphthaldehyde, 4,5'-bis(dimethylamino)-benzophenone, fluorene-9-one, 1'-acetonaphthone, 2'-acetonaphthone, 2,3-butanedione, and combinations thereof. Commercial examples include: Ciba IRGACURE® 651, a benzyldimethyl-ketal, from Ciba, Tarrytown, N.Y., USA; Additol BCPK, a benzophenone phenyl ketone eutectic, from Cytec Industries, West Paterson, N.J., USA; and Ciba IRGACURE®, a phosphine oxide, from Ciba, Tarrytown, N.Y., USA.

In an additional embodiment, the composition undergoes a UV-thermal "dual cure." In this embodiment, the oxygen barrier composition comprises a meta-substituted resorcinol epoxy resin (such as RDGE) capable of being thermally latent cured (B-stageable) and a meta-substituted acrylic resorcinol resins or meta-substituted methacrylic-resorcinol resin (such as resorcinol epoxy acrylate or methacrylate) capable of being UV-cured. An amount of free-radical photoinitiator (such as the compounds discussed above) may be added to the composition to assist in UV-curing the meta-substituted acrylic resorcinol resin or meta-substituted methacrylic-resorcinol resin. Additionally, an amount of thermal latent curing agent may be added to the composition to assist in thermally curing the resorcinol epoxy resin (such as an aromatic amine, anhydride, DICY, etc.). The composition, including the two types of curing agents, may be partially cured to a tack-free state via UV free-radical polymerization. During this curing step, the resorcinol epoxy resin may remain substantially unpolymerized. The composition may then undergo the final, thermal cure of the epoxy component with heat.

EXAMPLES

Example 1

100% Solids Low Chlorine Oxygen Barrier Encapsulant Formulation for Electronic Devices Containing RDGE 25 g of molten resorcinol diglycidyl ether (RDGE, CVC Thermoset Specialties), with a total chlorine concentration of approximately 2500 ppm, was combined and well mixed with 75 grams of bisphenol-F epoxy (YL-983U, Japan Epoxy Resins), with a total chlorine concentration of approximately 300 ppm, in a plastic beaker. To this homogeneous clear pale yellow solution, 5 grams of dicyandiamide (Omicure DDA 5, CVC Thermoset Specialties) and 5 grams of 4,4' methylene bis(phenyl dimethyl urea) (Omicure U-52, CVC Thermoset Specialties) were added and well mixed to produce an opaque suspension. The total chlorine content of the mixture was calculated to be 773 ppm from chlorine analysis of each separate ingredient. Separate laboratory analysis of the composition was performed using Parr bomb oxidative digestion followed by ion chromatography reported 798 ppm total chlorine.

Oxidation sensitive PPTC devices containing low-resistivity metal filler were coated or otherwise encapsulated with the above formulation by manual or automated means, and were partially cured at 125° C. in an oven for 1 hour to produce a conformal tack-free film, approximately 0.05 to 0.065 mm thick (2 to 25 mil thick), depending on the device form factor or packaging scheme. The devices thus encapsulated in the partially cured solid epoxy were further processed to produce a functional package. Final cure was achieved during a 260° C. solder reflow step, as confirmed by differential scanning calorimetry.

Alternatively, the epoxy formulation was cured in one step by exposure to 170° C. heat for 2 hrs. The oxygen and moisture barrier properties of the encapsulant formulation may be confirmed by testing using industry standard methods, such as ASTM F-1927, which may be tested using equipment from Mocon Industries.

PPTC devices derived from the above processing and packaging were electrically leaded, and subjected to accelerated oxidation testing at high oxygen partial pressures. The change in electrical resistance before and after thermal trip was less than 2×.

Example 2

100% Solids Low Chlorine Oxygen Barrier Encapsulant Formulation for Electronic Devices Containing Tetraglycidyl Meta-xylenediamine 25 g of tetraglycidyl meta-xylenediamine (ERISYS™ GA-240, CVC Thermoset Specialties), with a total chlorine concentration of approximately 2500 ppm, is combined and well mixed with 75 grams of bisphenol-F epoxy (YL-983U, Japan Epoxy Resins), with a total chlorine concentration of approximately 300 ppm, in a plastic beaker. To this homogeneous clear pale yellow solution, 4 grams of dicyandiamide (Omicure DDA 5, CVC Thermoset Specialties) and 3 grams of 4,4' methylene bis(phenyl dimethyl urea) (Omicure U-52, CVC Thermoset Specialties) are added and well mixed to produce an opaque suspension. The total chlorine content of the mixture is 773 ppm.

Oxidation sensitive PPTC devices containing low-resistivity metal filler are coated or otherwise encapsulated with the above formulation by manual or automated means, and are partially cured at 125° C. in an oven for 1 hour to produce a conformal tack-free film, approximately 0.05 to 0.065 mm thick (2 to 25 mil thick), depending on the device form factor or packaging scheme. The devices thus encapsulated in the partially cured solid epoxy are further processed to produce a functional package. Final cure is achieved during a 260° C. solder reflow step.

Example 3

High Glass Transition Temperature 100% Solids Low Chlorine Oxygen Barrier Encapsulant Formulation for Electronic Devices The glass transition temperature (Tg) of the formulations in Example 1 were tuned or manipulated by addition of, or substitution with, varying amounts of bifunctional resin while still maintaining acceptable oxygen barrier properties and low total chlorine levels. The glass transition temperature of the fully cured epoxy formulation described in Example 1 was increased from 110° C. to 160° C. as follows: 25 g of molten resorcinol diglycidyl ether (RDGE, CVC Thermoset Specialties) with a total chlorine concentration of approximately 2500 ppm, was combined and well mixed with 75 grams of low-chlorine (approximately 900 ppm) bifunctional distilled naphthalene type liquid epoxy resin (EPICLON HP-4032D, DIC Corporation, Japan) in a plastic beaker. To this homogeneous clear pale yellow solution, 5 grams of dicyandiamide (Omicure DDA 5, CVC Thermoset Specialties) and 5 grams of 4,4' methylene bis(phenyl dimethyl urea) (Omicure U-52, CVC Thermoset Specialties) was added and well mixed to produce an opaque suspension. The total chlorine mass balance of the mixture was calculated to be 1182 ppm. The glass transition temperature (Tg) of this formulation was found to be 160° C. by differential scanning calorimetry after a cure schedule described in Example 1. PPTC devices encapsulated in this formulation may be confirmed by testing using industry standard methods, such as those described in Example 1.

Example 4

Ultra Low-Chlorine High Glass Transition Temperature 100% Solids Low Chlorine Oxygen Barrier Encapsulant Formulation for Electronic Devices The formulation described in Example 3 is modified by addition of 35 g of Denka FB-5D fused silica filler (24% by weight filler/combined resin and filler), thus reducing the total chlorine level for the formulation from 1182 ppm to about 897 ppm.

Example 5

Highly Filled Ultra Low-Chlorine Low Viscosity 100% Solids Low Chlorine Oxygen Barrier Encapsulant Formulation for Electronic Devices A low-shrinkage underfill formulation with sub-900 ppm chlorine levels similar to that described in Example 1 was prepared with a 50:50 wt. percent ratio of RDGE:YL983U and Denka FB-5D fused silica filler (D50=4.8 micron). Addition of the Denka product achieved the multiple goals of low chlorine level (sub-900 ppm), good barrier properties, low-viscosity, and reduced epoxy usage. The 50% by weight silica filled formulation provided a cured resin matrix with 636 ppm total chlorine. PPTC devices derived from the above processing and packaging were electrically leaded, and subjected to accelerated oxidation testing at high oxygen partial pressures. The change in electrical resistance before and after thermal trip was less than 2×.

Example 6

High Viscosity 100% Solids Low Chlorine Oxygen Barrier Encapsulant Formulation for Electronic Devices The formulation described in Example 1 had a Brookfield viscosity of 1000 cps. Addition of 2% by weight Cabot CAB-O-SIL TS-720 fumed silica filler to the formulation in Example 1 increased the viscosity 10-fold after mixing in a Flak-Tek Speed mixer. The formulation thus obtained enabled drip and run free application of the barrier coating.

Example 7

High Viscosity 100% Solids Low Chlorine Oxygen Barrier Formulations for Electronic Devices High viscosity oxygen barrier formulations, suitable for electronic device encapsulation or for the preparation of B-stage epoxy impregnated fiberglass sheets were prepared as follows: 10 g of solid bisphenol-F resin of 2270 epoxy equivalent weight (Epikote 4007P, Japan Epoxy Resins), was dissolved in 25 g of molten resorcinol diglycidyl ether (RDGE, CVC Thermoset Specialties) at 50° C. with stirring over a 1 hour period. To this warm mixture, 65 grams of bisphenol-F epoxy (YL-983U, Japan Epoxy Resins) was added and well stirred until homogeneous. After cooling to 25° C., the Brookfield viscosity of the solution was 15,000 cps (speed 10, spindle 3, and 4). Thinning or cutting of the viscous solution (if needed) may be achieved by adding an appropriate amount of solvent such as methyl ethyl ketone. The total chlorine content of the mixture was 837 ppm. A variety of these mixtures were prepared by varying the components to achieve the desired viscosity, as shown in Table 1 below.

Curing of the 10 g bis-F/25 g RDGE/65 g bis-F mixture is achieved by addition of 5 grams of dicyandiamide (Omicure DDA 5, CVC Thermoset Specialties) and 5 grams of 4,4' methylene bis(phenyl dimethyl urea) (Omicure U-52, CVC Thermoset Specialties) is added and well mixed to produce an opaque suspension. A similar cure regime outlined in Example 1 may be used. Alternatively, a formulation containing 5 phr DICY and 2 phr phenyl urea accelerator are cured at 150° C. for 2 hours. Final cure is achieved in a solder reflow step under nitrogen.

Example 8

Fabrication of B-stageable Low Chlorine Oxygen Barrier Fiberglass Pre-Preg Sheets Oxygen barrier epoxy formulations based on RDGE and a bisphenol-F novolac resin were prepared for fabrication of epoxy impregnated B-stageable fiberglass sheets. PPTC devices are conformally encapsulated in the oxygen barrier pre-pregs by application of heat and pressure to achieve final cure or C-stage, and thus protected from oxygen ingress. The total chlorine content of the pre-preg sheets described below is sub-1500 ppm by dilution of the total epoxy chlorine by suitable fillers and/or a fiberglass reinforcing cloth.

A total of 4 types of formulations were developed and coated on 1080 E-grade woven glass. As shown in Table 1 below, two resins were combined in beakers and well mixed: ERISYS RDGE-H (CVC Thermoset Specialties) and a 3.6 functional epoxy phenol novolac resin EPPALOY 8350 (CVC Thermoset Specialties). The curing package for the formulations consisted of 3.5 phr dicyandiamide (DICY, Omicure DDA 5, CVC Thermoset Specialties and 0.03 phr 2-methyl imidazole (2MI) as the accelerator. Approximately 2% by weight filler/combined resin and filler of organoclay filler (Cloisite 10A, Southern Clay Products) was utilized in formulation 3 for increased viscosity and ease of handling. The resins were screened for reactivity at different ratios using a gel tester to measure the gel time. Based on gel time and viscosities, the following formulations were deemed feasible for preparation of hand pulled pre-pregs:

TABLE 1

Formulations of Oxygen Barrier Compositions, and Their Gel Times

| Formulation | RDGE wt % | 8350 epoxy wt % | DICY phr | 2MI phr | Cloisite 10A wt % | Gel Time @ 171° C., Sec |
|---|---|---|---|---|---|---|
| 1 | 25 | 75 | 3.5 | 0.03 | 0 | 205 |
| 2 | 15 | 85 | 3.5 | 0.03 | 0 | 222 |
| 3 | 50 | 50 | 3.5 | 0.03 | 2 | 200 |
| 4 | 5 | 95 | 3.5 | 0.03 | 0 | 183 |

The gel times were determined in order to optimize the B-staging conditions. Typically, gel times between 150 and 250 seconds translate into workable B-staging conditions. Approximately 60+/−2% by weight of the barrier composition/fiberglass combined was targeted for the resin content (with the remaining approximate 40% by weight being attributed to the fiberglass) on all four formulations and a resin flow of 10-20% using IPC test method TM-650-2.3.17 for resin flow. The B-staging conditions were in the range of 5-6 minutes at 171° C. A hand-pulling station was used to try and maintain the resin content at 60+/−2% by weight resin. A single ply laminate of each of the formulations was made using standard epoxy lamination cycle (360° F. for 90 minutes) and the glass transition temperature was measured by differential scanning calorimetry (DSC). Table 2 below lists the results:

TABLE 2

Glass Melting Temperature Comparisons

| Formulation | $T_g$ by DSC, ° C. |
|---|---|
| 1 | 137 |
| 2 | 137 |
| 3 | 116 |
| 4 | 109 |

Example 9

Fabrication of B-Stageable Ultra-Low Chlorine Oxygen Barrier Fiberglass Pre-Preg Sheets B-stageable pre-preg sheets are prepared similarly as per Example 8, but using a high viscosity resin system as described in Example 7. The total chlorine content of a pre-preg sheet (60% wt. resin) is 502 ppm.

Example 10

Method of Use of B-Stageable Low Chlorine Oxygen Barrier Fiberglass Pre-Preg Sheets for Encapsulation of PPTC Devices A 0.41 mm thick C-Stage FR4 core with CNC routed pockets (i.e., 2.46 mm×2.13 mm×0.41 mm) were tack laminated to 1 ply of 1060 E-grade glass oxygen barrier pre-preg sheets and a 0.25 oz per sq. ft. copper weight foil. The pre-preg sheets utilized one of the four formulations detailed in Example 8. Tack lamination was achieved by use of pressure and heat in a hydraulic lamination press. The tack lamination profile used a temperature of 150° C. and pressure of 100 to 150 psi for 1 to 2 min. After tack lamination, PPTC devices (i.e., 2.25 mm×1.84 mm×0.38 mm) were populated into the pockets of the tack laminated C-Stage FR4 Core. The PPTC chips were encapsulated within the C-Stage FR4 core with the B-staged oxygen barrier pre-preg sheets using a lamination process to allow the B-staged pre-preg resin to gel, flow, and fill around the PPTC chips. The lamination process was performed with a vacuum assisted hydraulic lamination press. The encapsulation lamination profile used the parameters listed below in Table 3.

TABLE 3

Encapsulation Lamination Process Conditions

| Parameter | Setting Value | Units |
|---|---|---|
| Temperature Rate of Rise (Between 100-185 C.) | 2 to 6 | C./min |
| Cure Temperature | 165 to 185 | C. |
| Time at Cure Temperature | 60 to 90 | min |
| Initial Pressure | 50 | PSI |
| Pressure (Above 110 C.) | 200 to 250 | PSI |
| Vacuum Pressure | 29 | mmHg |
| Rate of Cool (Cool to <110 C.) | 2 to 6 | C./min |

Example 11

Method of Use of an A-Stage Resin and B-Stageable Low Chlorine Oxygen Barrier Fiberglass Pre-Preg Sheets for Encapsulation of PPTC Devices PPTC Devices (i.e., 2.25 mm×1.84 mm×0.38 mm) were populated into a 0.41 mm thick C-Stage FR4 core with CNC routed pockets (i.e., 2.46 mm×2.13 mm×0.41 mm). A temporary film with adhesive (i.e., polyimide film) is applied to one side of the C-Stage FR4 core. The A-stage barrier epoxy resin formulation described in Example 1 was applied into the C-Stage core pockets, filling around the PPTC Devices. The core with the applied barrier epoxy resin was degassed under a vacuum of 30 mmHg for 6 to 24 hours. The core with applied barrier epoxy resin was then baked in a convection oven at 150° C. for 60 minutes to allow the A-Stage Barrier Epoxy to cure to a near C-Stage state. Excess cured epoxy was removed by planarizing the core's surface with a sanding process. The core was then treated with an oxygen burn plasma process to prepare the epoxy surface for lamination. Conditions for the plasma cycle are illustrated below in Table 4.

TABLE 4

Plasma Cycle Conditions.

| Oxygen Concentration (%) | Vacuum Pressure (mTorr) | Process Time (min) |
|---|---|---|
| 100 | 250 | 10 |

After plasma treatment, copper foils are laminated to both sides of the core using 106 E-Glass FR4 pre-preg sheets. The lamination process was performed using a vacuum assisted hydraulic press with the process conditions in Table 3.

PPTC devices derived from the above processing and packaging were electrically leaded, and subjected to accelerated oxidation testing at high oxygen partial pressures. The change in electrical resistance before and after thermal trip was less than 2×.

Example 12

B-Stageable Aromatic Amine Cured Low Chlorine Oxygen Barrier Encapsulant Formulation for Electronic Devices A 1 pot B-stageable formulation is prepared using the aromatic amine curing agent 3,3'-diaminodiphenyl sulfone (OMICURE™ 33DDS, 62.1 g/H mole eq., CVC Thermoset Specialties). OMICURE 33DDS is known for its low halogen content. To achieve appropriate cure, the moles of epoxy groups in a formulation are calculated (given EEW or epoxy equivalent weight) and the moles of active amine hydrogens needed to react with those epoxide groups are determined. For example, 25 g of molten resorcinol diglycidyl ether (RDGE, 120 EEW, CVC Thermoset Specialties), is combined and well mixed with 75 grams of bisphenol-F epoxy (YL-983U, 170 EEW, Japan Epoxy Resins) in a plastic beaker. The total moles of epoxy in 25 g of RDGE is 0.21. The total moles of epoxy in 75 g of YL983U is 0.44. To the well stirred mixture, 40.4 g of OMICURE 33DDS (62.1 g/mole H) is added at 30° C. until homogeneous. The mixture thus obtained is used directly or, or suitable fillers may be added to modify the viscosity characteristics. After application to an oxidation sensitive PPTC device, the coating is partially cured at 100° C. in an oven for 2-6 hours to produce a conformal tack-free film, approximately 0.05 to 0.065 mm (2 to 25 mil thick), depending on the device form factor or packaging scheme. The devices thus encapsulated in the partially cured solid epoxy can were further processed to produce a functional package. Final cure is achieved during a 260° C. solder reflow step, as confirmed by differential scanning calorimetry.

Example 13

DICY Cured and Resorcinol Accelerated Low Chlorine Oxygen Barrier Encapsulant Formulation for Electronic Devices A 1 pot formulation is described using DICY curing agent and resorcinol accelerator. Herein, resorcinol functions both as an accelerator to lower the temperature of cure and to further enhance the oxygen barrier properties of the composition. For resorcinol acceleration and enhanced oxygen barrier properties, the mole ratio used is: 1 epoxy≥0.4 OH≥0.6 NH. As per this ratio, and to achieve appropriate cure, the moles of epoxy groups in a formulation are calculated (given EEW or epoxy equivalent weight), as well as the moles of active DICY and active resorcinol hydrogen to react with those epoxide groups. For example, 75 grams of bisphenol-F epoxy (YL-983U, 170 EEW, Japan Epoxy Resins) and 9.7 g of resorcinol (INDSPEC Chemical Corporation, Petrolia, Pa., USA) are combined and well mixed in a plastic beaker. The total moles of epoxy in 75 g of YL983U is 0.44. To the well stirred mixture, 5.5 g of OMICURE DDA 5 (21 g/mole H, CVC Thermoset Specialties) is added, and stirred for an additional 10 minutes. The mixture thus obtained is used directly or, or suitable fillers may be added to modify the viscosity characteristics. After application to an oxidation sensitive PPTC device, the coating is partially cured at 125° C. in an oven for 2 hours to produce a conformal tack-free film, approximately 0.05-0.65 mm thick (2 to 25 mil thick), depending on the device form factor or packaging scheme. The devices thus encapsulated in the partially cured solid epoxy can were further processed to produce a functional package. Final cure is achieved during a 260° C. solder reflow step, as confirmed by differential scanning calorimetry. The chlorine content of this composition is approximately 600 ppm.

Example 14

Radiation Curable 100% Solids Oxygen Barrier Encapsulant Formulation for Electronic Devices 9 grams of resorcinol epoxy acrylate, (NEOPOL 8312, Japan U-PiCA, $10^5$ Cps, oxygen permeation rate: 0.1 $cm^3 \cdot mm/m^2 \cdot day \cdot atm$), was combined and well mixed with 1 gram of phosphoric acid ester acrylate (Sartomer CD 9050, 20 cps) in a vial, to produce a homogeneous solution with enhanced wet-out and adhesion to PPTC circuit protection devices. To this solution 0.3 g of 1:1 benzophenone phenyl ketone eutectic photoinitiator is added (Additol BCPK, Cytec industries) and well mixed. Oxidation sensitive 3×4 mm radial leaded PPTC chips were manually coated with the formulation using a brush or by dipping, and warmed at 50° C. in an oven for 20 minutes to remove bubbles and enhance coating conformality. After removal from the oven, excess pooled drops of epoxy were removed from the parts by dabbing, and the parts were transferred to a Loctite UV cure system, and exposed to 800 mJ/cm² dose of radiation from a 300 W mercury lamp. The exposure was repeated for each side of the device to ensure cure in 3 dimensions.

PPTC devices derived from the above processing were subjected to accelerated oxidation testing at high oxygen partial pressures. The change in electrical resistance before and after thermal trip was less than 2×.

Example 15

Radiation Curable 100% Solids Low Chlorine Oxygen Barrier Encapsulant Formulation for Electronic Devices As per the method in Example 14, low chlorine NEOPOL 8312, derived from specially purified low chlorine resorcinol diglycidyl ether (1000 ppm total Cl), is combined with a cyclic acrylic ester (Sartomer CD 420, 6 cps) and Cytec Additol BCPK. After cure, the oxygen barrier properties of the formulation may be confirmed by testing the electrical resistance of the PPTC devices before and after thermal trip, after accelerated oxidation exposure for 1 week. The change in electrical resistance before and after thermal trip was less than 2×.

Example 16

Radiation Curable 100% Solids Oxygen Barrier Encapsulant Formulation for Electronic Devices As per the method in Example 14, NEOPOL 8312 was combined with N-vinyl pyrrolidone (ISP, 6 cps) and Cytec Additol BCPK. After cure, the oxygen barrier properties of the formulation were confirmed by testing the electrical resistance of the PPTC devices before and after thermal trip, after accelerated oxidation exposure for 1 week. The change in electrical resistance before and after thermal trip was less than 2×.

Example 17

Non-Reactive Diluent/Solvent Born Radiation Curable Oxygen Barrier Encapsulant Formulation for Electronic Devices As per the method in Example 14, 8 to 9 grams of NEOPOL 8312 were combined with 1 to 2 grams of the following diluting non-reactive solvents: methyl ethyl ketone, ethyl acetate, or 1-methoxy-2-propanol. During the cure step, the solvent is substantially removed by evaporation. After cure, the oxygen barrier properties of the formulation were confirmed by testing the electrical resistance of the PPTC devices before and after thermal trip, after accelerated oxidation exposure for 1 week. The trip jump, or change in resistance, before and after trip, was found to be less than 3×.

Example 18

Clear Non-Opaque Radiation Curable, B-Stageable 100% Solids Oxygen Barrier Encapsulant Formulation for Electronic Devices 2.5 grams of resorcinol epoxy acrylate (NEOPOL 8312, Japan U-PiCA, $10^5$ cps), a viscous syrup, is combined and well mixed with 7.5 grams of molten resorcinol diglycidyl ether (RDGE, CVC Thermoset Specialties), and 1.0 g of meta-phenylenediamine (DuPont) to produce a clear non-opaque homogeneous solution. With exclusion of ambient light, 0.4 g of 1:1 benzophenone phenyl ketone eutectic photoinitiator (Additol BCPK, Cytec Industries) is added. The total chlorine content of the mixture is calculated to be approximately 875 ppm.

Oxidation sensitive 3×4 mm PPTC chips are manually coated with the formulation using a brush or by dipping, and the parts are transferred to a Loctite UV cure system, and exposed to 800 mJ/cm$^2$ dose of radiation from a 300 W mercury lamp. The exposure is repeated for each side of the device to ensure cure in 3 dimensions. The coating thickness on the PPTC chips typically ranges from approximately 0.025 to 0.13 mm (1 to 5 mil).

A device coated with the partially cured resin encapsulant is further processed to produce a functional leaded package over a 3 hour time period. Final cure is achieved during a 260° C. solder reflow step, and is confirmed by differential scanning calorimetry. The oxygen barrier properties of the formulation are confirmed by testing the electrical resistance of the PPTC device before and after thermal trip, after accelerated oxidation exposure for 1 week. The trip jump, or change in resistance, before and after trip, is found to be less than 3×.

Although examples have been described herein, it should be appreciated that any subsequent arrangement designed to achieve the same or similar purpose may be substituted for the specific examples shown. This disclosure is intended to cover any and all subsequent adaptations or variations of various examples. Combinations of the above examples, and other examples not specifically described herein, may be apparent to those of skill in the art upon reviewing the description.

The Abstract is provided with the understanding that it will not be used to interpret or limit the scope or meaning of the claims. In addition, in the foregoing Detailed Description, various features may be grouped together or described in a single example for the purpose of streamlining the disclosure. This disclosure is not to be interpreted as reflecting an intention that the claimed examples require more features than are expressly recited in each claim. Rather, as the following claims reflect, inventive subject matter may be directed to less than all of the features of any of the disclosed examples. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other examples, which fall within the true spirit and scope of the description. Thus, to the maximum extent allowed by law, the scope is to be determined by the broadest permissible interpretation of the following claims and their equivalents, and shall not be restricted or limited by the foregoing detailed description.

What is claimed is:

1. An oxygen barrier composition for an electrical component comprising:
   a meta-substituted aromatic resin which is resorcinol diglycidyl ether;
   an additional aromatic epoxy resin selected from the group consisting of: bisphenol-F diglycidyl ether, bisphenol-A diglycidyl ether, epoxidized phenol novolac resins, epoxidized cresol novolac resins, polycyclic epoxy resins, naphthalene diepoxides, and combinations thereof; and
   an amine curing agent for effectuating a thermal latent cure, the amine curing agent comprising dicyandiamide;
   wherein the composition is capable of undergoing a B-stageable cure achieved by a thermal latent cure,
   wherein the composition has an oxygen permeability of less than approximately 0.4 cm$^3$·mm/m$^2$·atm·day at approximately 0% relative humidity and approximately 23° C., and
   wherein the composition is substantially 100% solids.

2. The composition of claim 1, wherein the additional aromatic epoxy resin is bisphenol-F diglycidyl ether.

3. The composition of claim 1 further comprising an accelerant capable of reducing the time or temperature of the thermal latent cure, wherein the accelerant is selected from the group consisting of: phenyl ureas, imidazoles, boron trichloride amine complexes, aliphatic bis ureas, meta-substituted phenols, resorcinol, phloroglucinol, and combinations thereof.

4. The composition of claim 3, wherein the accelerant is a phenyl urea accelerant selected from the group consisting of: phenyl dimethyl urea, 4,4' methylene bis (phenyl dimethyl urea), 2,4' toluene bis (dimethyl urea), and combinations thereof.

5. The composition of claim 1 further comprising a filler selected from the group consisting of: platelet fillers, reinforcing fillers, alumina fillers, and silica fillers, boron nitride, and combinations thereof.

6. The composition of claim 1, wherein the composition is a B-staged composition in a shape selected from the group consisting of a powder, pellet, tape, film, and pre-preg sheet.

* * * * *